United States Patent
Khan

(10) Patent No.: US 10,127,334 B2
(45) Date of Patent: Nov. 13, 2018

(54) COMPUTER METHOD AND APPARATUS CONVERTING PROCESS ENGINEERING APPLICATION DATA INTO A CANONICAL FLOWSHEET REPRESENTATION

(71) Applicant: Aspen Technology, Inc., Burlington, MA (US)

(72) Inventor: Mir Khan, Houston, TX (US)

(73) Assignee: Aspen Technology, Inc., Bedford, MA (US)

( * ) Notice: Subject to any disclaimer, the term of this patent is extended or adjusted under 35 U.S.C. 154(b) by 474 days.

(21) Appl. No.: 13/693,812

(22) Filed: Dec. 4, 2012

(65) Prior Publication Data

US 2013/0144591 A1 Jun. 6, 2013

Related U.S. Application Data

(60) Provisional application No. 61/630,112, filed on Dec. 5, 2011, provisional application No. 61/567,298, filed on Dec. 6, 2011.

(51) Int. Cl.
*G06F 17/50* (2006.01)
*G06G 7/48* (2006.01)

(52) U.S. Cl.
CPC ...... *G06F 17/5009* (2013.01); *G06F 17/5004* (2013.01)

(58) Field of Classification Search
None
See application file for complete search history.

(56) References Cited

U.S. PATENT DOCUMENTS

| | | | |
|---|---|---|---|
| 6,442,512 B1 | 8/2002 | Sengupta et al. | |
| 7,043,311 B2* | 5/2006 | Nixon et al. | 700/83 |
| 7,117,052 B2* | 10/2006 | Lucas et al. | 700/83 |
| 8,396,695 B2* | 3/2013 | Kelly et al. | 703/2 |
| 8,855,968 B1* | 10/2014 | Gillis | 702/182 |
| 2003/0097243 A1* | 5/2003 | Mays et al. | 703/2 |
| 2011/0264415 A1 | 10/2011 | Bleackley et al. | |

OTHER PUBLICATIONS

Walker, V., "Basics Designing a Process Flowsheet," *Chemical Engineering Progress*, pp. 15-21 (May 31, 2009).

(Continued)

*Primary Examiner* — Aniss Chad
*Assistant Examiner* — Nithya J. Moll
(74) *Attorney, Agent, or Firm* — Hamilton, Brook, Smith & Reynolds, P.C.

(57) ABSTRACT

Process engineering software applications have respective proprietary in nature and disconnected model representations of a manufacturing or processing facility. The invention method and apparatus extract from the various applications topology of equipment and streams for a facility. From the extracted data, a convertor or adapter of the invention system derives a common canonical model. To support the common canonical model (e.g., a Flowsheet object in embodiments), the converter/adapter maps or associates one or more physical assets to a logical asset, and arranges a working hierarchy of assets that can be navigated, queried and filtered.

18 Claims, 7 Drawing Sheets

(56) References Cited

OTHER PUBLICATIONS

International Search Report and Written Opinion, issued in International Application No. PCT/US2012/067779, Title: Computer Method and Apparatus Converting Process Engineering Application Data Into a Canonical Flowsheet Representation, dated Nov. 13, 2013, 13 pages.

International Preliminary Report on Patentability, issued in International Application No. PCT/US2012/067779, Title: Computer Method and Apparatus Converting Process Engineering Application Data Into a Canonical Flowsheet Representation, dated Jun. 10, 2014, 8 pages.

* cited by examiner

FIG. 3

| Submodel: SCFP Cat Feed Pool | | | | | | |
|---|---|---|---|---|---|---|
| Submodel: SCNP Cat Naphtha Pool | | | | | | |
| Submodel: SCCU Cat Cracking Unit | | | | | | |
| Process Feeds | | Units | Units/DAY | Vol% | Units | Units/DAY | Wt% |
| HTG | Hydrotreated Gas Oil | BBLS | 38,000 | 63.33 | MTONS | 5,489 | 63.90 |
| AR1 | CD1 Atm Btms 670+ | BBLS | 18,000 | 30.00 | MTONS | 2,555 | 29.75 |
| UCO | Unconverted Oil | BBLS | 4,000 | 6.67 | MTONS | 546 | 6.36 |
| | Total | | 60,000 | 100.00 | | 8,591 | 100.00 |
| Process Yields | | Units | Units/DAY | Vol% | Units | Units/DAY | Wt% |
| H2S | H2S, KSCF | KSCF | 190 | | MTONS | 8 | 0.09 |
| FGS | Fuel Gas | KSCF | 8,633 | | MTONS | 313 | 3.64 |
| C3M | Mixed C3s | BBLS | 7,886 | 13.14 | MTONS | 649 | 7.55 |
| C4M | Mixed C4s | BBLS | 12,365 | 20.61 | MTONS | 1,148 | 13.36 |
| LCN | LCN (C5-350F) | BBLS | 35,890 | 59.82 | MTONS | 4,144 | 48.24 |
| HCN | HCN (350-430F) | BBLS | 3,391 | 5.65 | MTONS | 462 | 5.38 |
| LCO | Cat Crack Diesel | BBLS | 6,786 | 11.31 | MTONS | 991 | 11.54 |
| SLR | Cat Crack Slurry | BBLS | 2,740 | 4.57 | MTONS | 451 | 5.25 |
| CRB | Coke Burned, FOE | FOE* | 2,192 | | MTONS | 430 | 5.00 |
| LOS | Volume Losses | BBLS | -9,058 | -15.10 | | | |
| | Total | | 60,000 | 100.00 | | 8,596+ | 100.06 |

*Not included in total
+LOS is not included in the total

| Utilities Used/Produced | | Units/DAY | $/Units | $/DAY |
|---|---|---|---|---|
| FUL | Fuel MMBTU | 8,010 | 9.918 | 79,443 |
| KWH | Power KWH | 504,000 | 0.057 | 28,728 |
| STM | Steam MLBS | 2,280 | 11.452 | 26,111 |
| H2O | Cooling Water MGAL | 690 | 0.112 | 77 |
| CCC | Cat + Chem $ | 6,720 | 1.000 | 6,720 |
| | Total | | | 141,079 |

| Process Capacity Used | | Minimum | $/Units | $/DAY |
|---|---|---|---|---|
| RSD | FCC Resid Rate BPD | 0 | 18,000 | 60,000 |
| CCU | Cat Cracker BPD | 18,000 | 60,000 | 1,000 |
| CRB | Carbon Burnt TPD | 0 | 445 | |
| FGU | FCC Fuel Gas KSCF | 0 | 8,633 | |
| SLU | Slurry Pump Limit BP | 0 | 2,740 | |

FIG. 4

COMPUTER METHOD AND APPARATUS CONVERTING PROCESS ENGINEERING APPLICATION DATA INTO A CANONICAL FLOWSHEET REPRESENTATION

RELATED APPLICATION(S)

This application claims the benefit of U.S. Provisional Application No. 61/630,112, filed on Dec. 5, 2011 and U.S. Provisional Application No. 61/567,298 filed on Dec. 6, 2011.

The entire teachings of the above application(s) are incorporated herein by reference.

BACKGROUND OF THE INVENTION

In chemical simulation and process engineering, there are various model based software application programs. These model based applications solve planning, scheduling and accounting problems by representing the business problem in a manner loosely related to the physical assets of a processing plant, for example a refinery or petrochemical unit. The applications use a Flowsheet representation to represent the flow of materials through the process units.

For example, Aspen Technology, Inc. of Burlington, Mass. provides model based applications by the names of PIMS, APS, HYSYS and AORA to name a few. These software applications use a Flowsheet representation to represent the flows of subject chemicals or material through process units such has catalytic crackers, evaporators, reactors and the like. However, the use of the Flowsheet is desperate with PIMS creating a Flowsheet after the fact (process planning) while APS and AORA use the Flowsheet to define the process/simulation problem. Also, the representation of the Flowsheet in each of these applications is different with each physical asset being represented by a different set of operations.

Thus the art has shortcomings in the Flowsheet representations resulting from the various process engineering software applications.

SUMMARY OF THE INVENTION

The present invention relates to a computer method and system that generates a canonical flowsheet representation of a given process engineering model by interfacing with existing model-based process engineering applications. Applicants address the foregoing shortcomings of the prior art. Existing process engineering applications can execute models of extreme size and complexity, but lack an ability to visualize and navigate the various entities represented in the model in a consistent or generic way. Applicants see a need to aggregate and normalize process engineering application model data in order to create a customizable Flowsheet representation of the elements of the process. And applicants have discovered that in order to visualize the results of each of the foregoing process engineering applications on a consistent basis, it is necessary to create a canonical view of the Flowsheet. This canonical view may represent the physical assets of the processing plant, refinery or petrochemical unit.

In embodiments of the present invention, Applicant's solution is a system that generates a canonical Flowsheet using data from at least PIMS, APS and AORA (and the like). The system assembles common elements such as equipment and streams, into a hierarchal network for a certain model and case.

In one embodiment, the invention is directed to a computer-implemented (i.e., automated) method of converting processing engineering application data into a canonical flowsheet representation. The method includes interfacing with one or mode model-based process engineering applications to receive data, converting the received data into a canonical representation of the model-based process engineering application data, and using the canonical representation as an intermediary for other software applications to access the model-based process engineering applications data. In one embodiment, the canonical representation is a set of entities that form a flowsheet object. In another embodiment, converting the received data into a canonical representation includes determining and extracting common model elements from the received data, forming a hierarchy of the extracted model elements, said hierarchy being for a certain model and corresponding case, and, from the hierarchy, generating the canonical flowsheet representation of the certain model and corresponding case. In another embodiment, converting the received data into a canonical representation further includes normalizing the received data given a known data structure of the model-based process engineering application to enable a generic canonical representation.

In another embodiment, computer-implemented method of converting process engineering application data into a canonical flowsheet representation further includes providing a layered application framework for interfacing with higher-level software applications. These software applications could output the canonical representation to a visual display means or digital or print media. In other embodiments, these applications enable customization of the canonical representation or allow a process engineering application model to be executed from the canonical representation.

In another embodiment, a computer system for converting process engineering application data into a canonical flowsheet representation includes an input means for obtaining data from model-based applications, a digital processor, a working memory accepting the data from model-based applications, and a converter executed by the digital processor. The converter is operatively coupled to the working memory to receive on input the model-based applications data and a set of commands, and the converter converts the received input data to a canonical flowsheet representation. The computer system also includes an application program interface. The application program interface couples a user application to the converter and controls execution of the converter such that the converter outputs the canonical flowsheet representation to the user application. In one embodiment, the model-based applications include PIMS, APS, HYSYS, AORA, and other process engineering applications.

In another embodiment, the converter determines and extracts common model elements from across multiple model-based applications data, forms a hierarchy of the extracted model elements, said hierarchy being for a certain model and case, and, from the hierarchy, generates the canonical flowsheet representation of the certain model and case. In one embodiment, the converter further normalizes the received data given a known data structure of the model-based process engineering application to enable a generic canonical representation.

In yet another embodiment, a computer program product includes a computer readable storage medium having stored thereon a set of computer program instructions for converting process engineering application data into a canonical flowsheet representation. The set of computer program instruction include instructions to interface with one or more mode-based process engineering applications to receive data, normalize the received data from a known data structure of the mode-based process engineering application, convert the data into a canonical representation, and provide a layered application framework for execution of higher-level software applications. In another embodiment, at least some portion of the set of computer program instructions includes instructions to request data or requests instructions over a computer network.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 3 is a sample of input data from PIMS, a model-based process engineering application for production planning and optimization of refineries and petrochemical plants.

FIG. 4 is a sample of output data associated with an execution of PIMS given the input data set of FIG. 3.

DETAILED DESCRIPTION OF THE INVENTION

Figure 1:
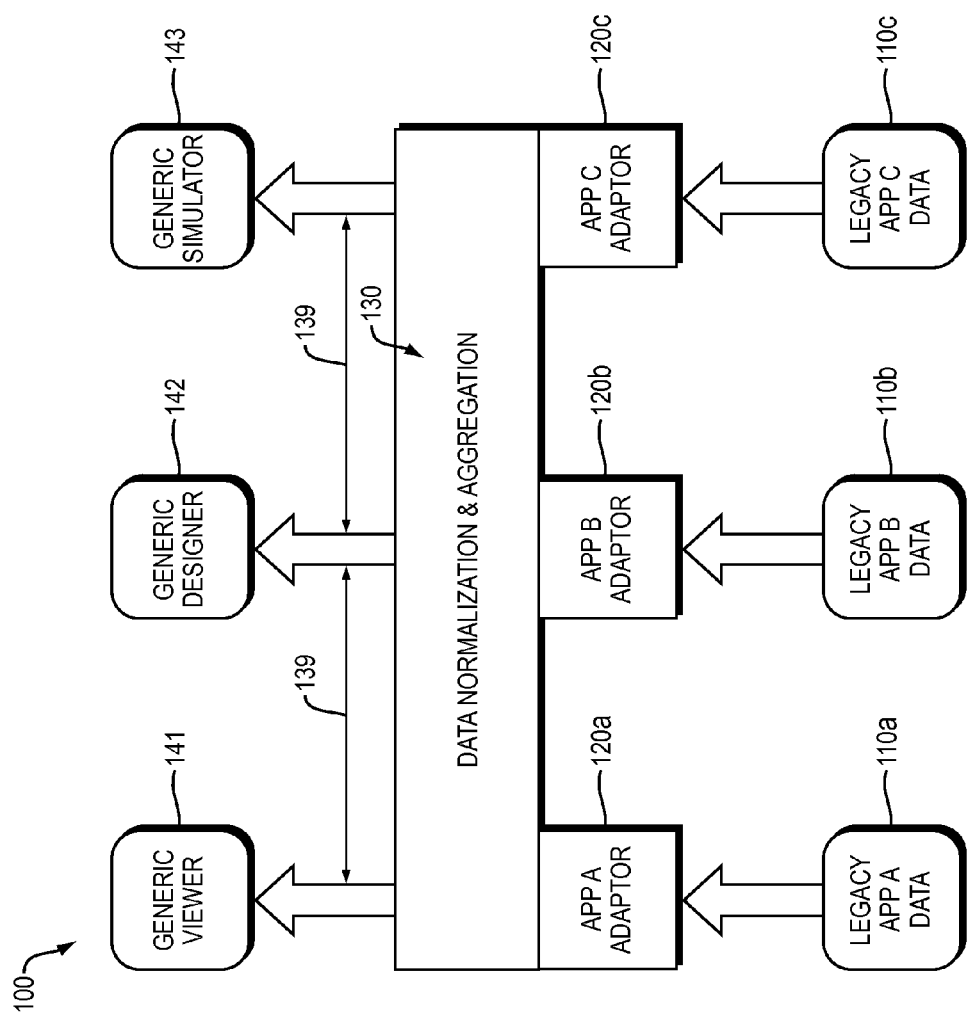
FIG. 1 is a flow chart of a computer system employing embodiments of the present invention.

A description of example embodiments of the invention follows.

The invention is directed towards a method and system of creating a canonical flowsheet representation of a process engineering model from data obtained through an interface with an existing model-based process engineering application.

One such type of model-based process engineering application is a process simulation and planning application (e.g., PIMS® by assignee Aspect Technologies, Inc., Burlington, Mass.), which is designed to enable refineries and petrochemical plants to run at maximum efficiency and profitability. This is accomplished by calculating all the flows and conditions throughout a facility. The calculations utilize the fundamental principals of physics, chemistry, and mathematics to allow optimization of feedstock evaluation, product slate production, and plant design and operations. Such optimizations enable refineries and petrochemical plants to run at maximum efficiency and profitability, but demand the creation of extremely complicated and precise models of the facility. As such, a large amount of input data is needed to create a rigorous simulation model of an oil and gas separation facility. The data that is typically entered in a rigorous simulator model includes, but is not limited to: composition of all feed streams into the plans, conditions of all feed streams into the plans (flows, temperatures and pressures), ambient conditions of the location in which the plant operates, conditions of all process utilities that are used in the plans (e.g., steam, hot oil, cooling water, etc.), specifications for the desired outputs of the plant, and any known constraints (e.g., emission limits for byproducts, total electrical energy consumed, various storage sizes, max flow rates, etc.).

The invention is directed towards a method and system of creating a canonical flowsheet representation of a process engineering model from data obtained through an interface with an existing model-based processing engineering application. Each software application that models a manufacturing or processing facility has its own proprietary mechanism to represent the physical assets (equipment) and their connectivity (streams) to each other. The canonical representation is suited for the problem domain that the application or the application users are solving. Communication between these software applications or the application users is hindered in the start due to this disconnect in model representations. In an ideal scenario, all software applications would reference a common model representing the network topology of equipment and streams for the facility. In reality, this is not feasible because of the complexity of the individual models and the proprietary nature of their design. There is a long legacy associated with these software applications and they have a significantly large installed base in the market.

The solution implemented by the present inventive method and system is to extract the model representations from these applications and derive a common canonical model. This canonical model is able to switch contexts between these software applications and thus allow one to have entity associations between software applications. The various embodiments of the inventive canonical representation presented here are designed to satisfy the following identified needs in the industry: (1) the canonical representation is of all supported versions of the source application, (2) a hierarchal organization is enabled by an ability to map or associate one or more logical or physical assets to a logical asset in the canonical representation, (3) there is an ability to query and filter the canonical asset network topology, and (4) the canonical model representation should be a flexible object model able to represent proprietary models given an adaptor with knowledge of the proprietary data structure.

Embodiments of the present invention have the following advantages over the prior art. The method and system can represent the entities from an enterprise down to a single equipment with each parent entity in the hierarchy having one or more children. Common elements such as model, equipment and stream are separated out from application specific characteristics. This makes it possible to have topology change by case (from PIMS data), not change by case (from APS data), and not have a case at all (from AORA data). Every object is cognizant of its position in the model in terms of connectivity or hierarchy. Multi-dimensional navigation up or down the hierarchy and into the network at any particular level of the hierarchy is enabled. A nonlimiting exemplary system 100 embodying the present invention is illustrated and described in conjunction with FIGS. 1-7.

A system 100 embodiment of the present invention, shown in FIG. 1, generates a canonical Flowsheet using data 110a, b, c from one or more process engineering applications (such as, PIMS, APS, or AORA) with very high performance characteristics. The canonical model is defined as a set of entities that form a Flowsheet object 201 of FIG. 2. The entity definitions are extracted from the source applications via the Application Adapters 120. Application-specific adaptors 120a, b, c (generally 120) contain the instructions for locating and extracting entities from the received data 110a, b, c. These Adapters 120 are essentially concrete implementations of the base classes provided by the framework. The Adapters 120 can be configured to communicate with the applications via a database connection, web services or an application API. Data extracted from these applications is organized in memory and is not persisted to disk. Only the mapping and hierarchy information is persisted on disk.

A Converter 130 normalizes the received data, aggregates common data elements in a single canonical representation of the entities present in the received data and forms a flowsheet object 201. Specifically, aggregation involves determining and extracting common model elements from the received data, forming a hierarchy of the extracted model elements for each case present in the model, and, from that hierarchy, generating a canonical flowsheet representation of the model and corresponding case(s).

Finally, in some embodiments, an application framework 139 is present and provides access to higher-level software applications to make use of the canonical flowsheet representation. The higher-level software application could be any type of generic viewer 141 that provides a user with a graphic interface and visual representation of the canonical flowsheet. In other embodiments, the higher-level software is any of a generic designer application 142 designed to customize the canonical representation by creating new logical or physical equipment entities to represent any portion of the canonical representation. In yet another embodiment, the higher-level software application is any type of a generic simulator 143 that enables the process engineering application model to be executed in its canonical flowsheet representation.

Figure 2:
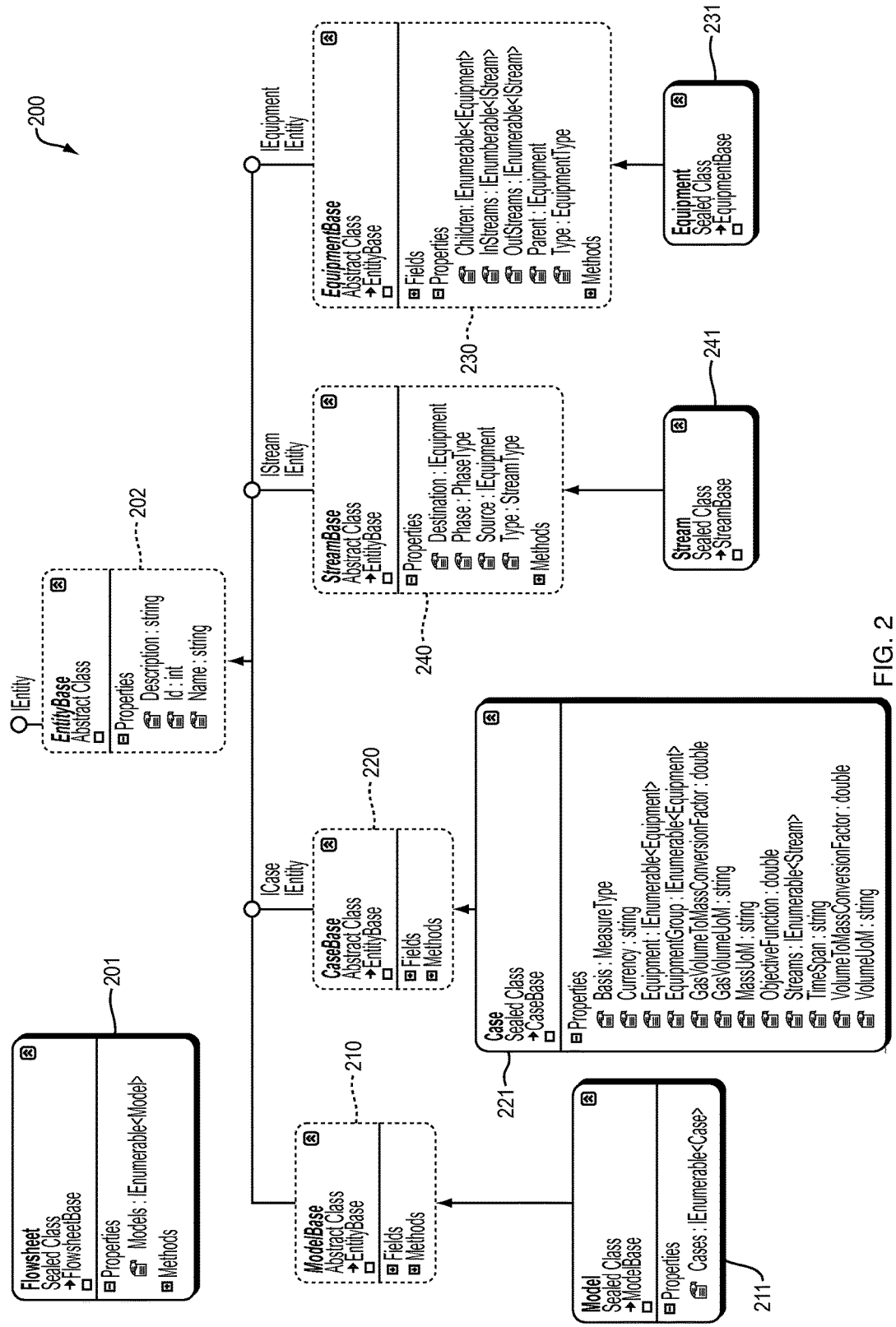
FIG. 2 is a class diagram of a canonical flowsheet generated in one embodiment of the present invention.

The canonical model is defined as a set of entities 202 that form a Flowsheet object 201 of FIG. 2. A class diagram and key entity descriptions of the canonical Flowsheet 200 are illustrated in FIG. 2, the component architecture of a computer-implemented system embodying elements of the present invention. The key entity abstractions present are: Model 210, Case 220, Equipment 230, and Stream 240. The Model class 210 represents the specific asset topology for the site, plant or facility represented by received model data 110a, b, c. There is no restriction on the number of models that can be defined. The Case class 220 is associated to the Model class 210. The Case class 220 represents possible scenarios the Model class 210 can structure. There is no restriction on the number of Cases that can be defined for a Model. The Equipment class 230 identifies all the assets in the topology of the model. An Equipment object 231 may contain one or more Equipment objects. There is no restriction on the number of Equipment objects that an Equipment object can contain. There is no restriction on the number of Equipment objects that can be defined. The Stream class 240 identifies the connectivity between Equipment entities (objects). Each Stream object 241 always has only two associated Equipment objects, the source and the destination. The Flowsheet Object 201 is populated by the system 100 shown in FIG. 1.

Figure 3:
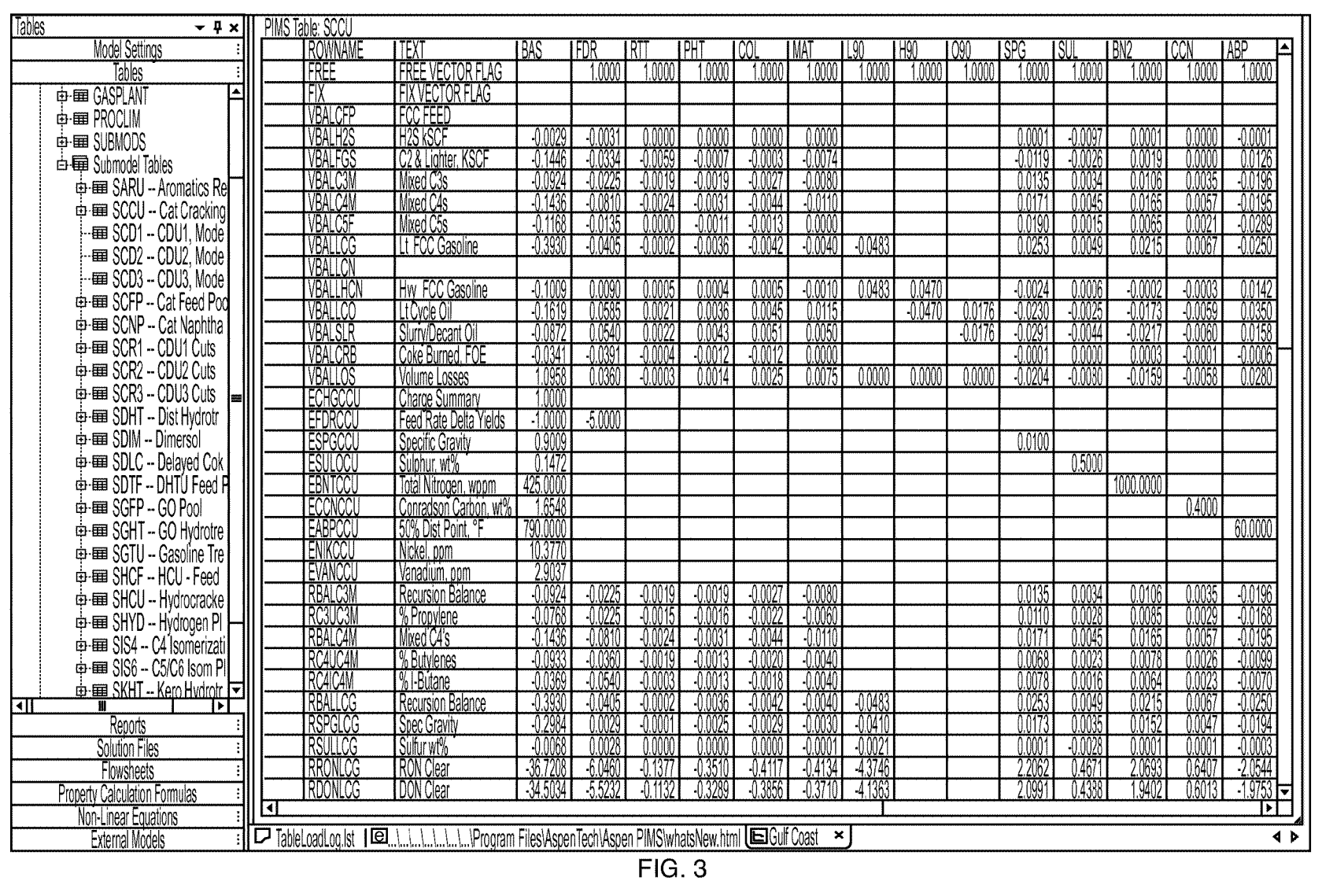

An example of input data for a PIMS model is shown in FIG. 3. This is a PIMS representation of the FCC (Fluid catalytic cracking) sub-model and it includes material balance, capacity consumption, utility consumption, property recursion, process limits and driver rows for a given case. The columns in this table include the base vector and all the delta vectors that influence yields and other calculable values associated with the operation of an FCC. The equipment and stream connectivity is inferred via the ROWNAME column header. Additional sub-models contained in this PIMS model are displayed on the left, and represent other equipment classes contained in the model, with logical or physical representations.

A screenshot of a PIMS report is shown in FIG. 4. This figure represents the solution data for the FCC sub-model shown in FIG. 3. The data is categorized as the feeds and products, utility consumptions and productions, capacity utilizations, process limits and feed qualities and operating conditions.

Figure 5:
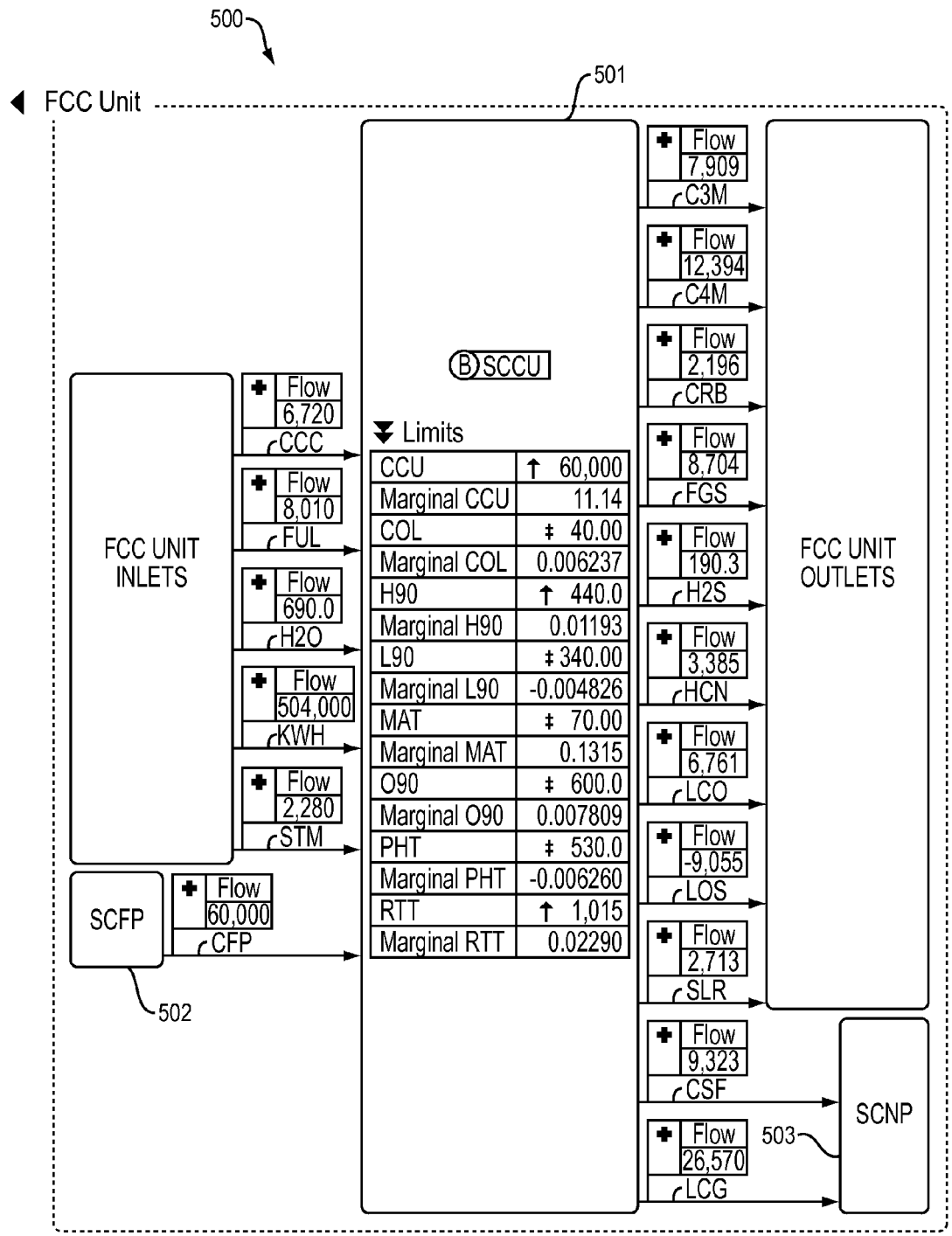
FIG. 5 is a canonical flowsheet representation of a portion of the industrial process displayed in FIG. 3 and FIG. 4.

A canonical flowsheet representation 500 of the PIMS report shown in FIG. 4 is presented in FIG. 5. The inventive system described herein interfaces with PIMS (an application) to obtain the input data 110, a portion of which is displayed in FIG. 3 for an FCC, and solution data 110, a portion of which is displayed in FIG. 4 for an FCC, in order to generate the canonical representation 500 shown in FIG. 5. From the input data, the equipment and stream connectivity is determined based on the ROWNAME data for each extracted model element. The connected equipment elements 501, 502, 503 displayed in the flowsheet of FIG. 5 reflect the organizational hierarchy determined from the data in FIG. 3. The inventive system 100 normalizes the received PIMS model representation, for example the process stream and utility stream are aggregated to create a single canonical representation of the FCC process solution of FIG. 4. In this embodiment, an application framework 139 is present and leveraged by a UI (user interface) implementation to display a graphical representation of the canonical flowsheet 500 assembled by the present inventive method.

Figure 6:
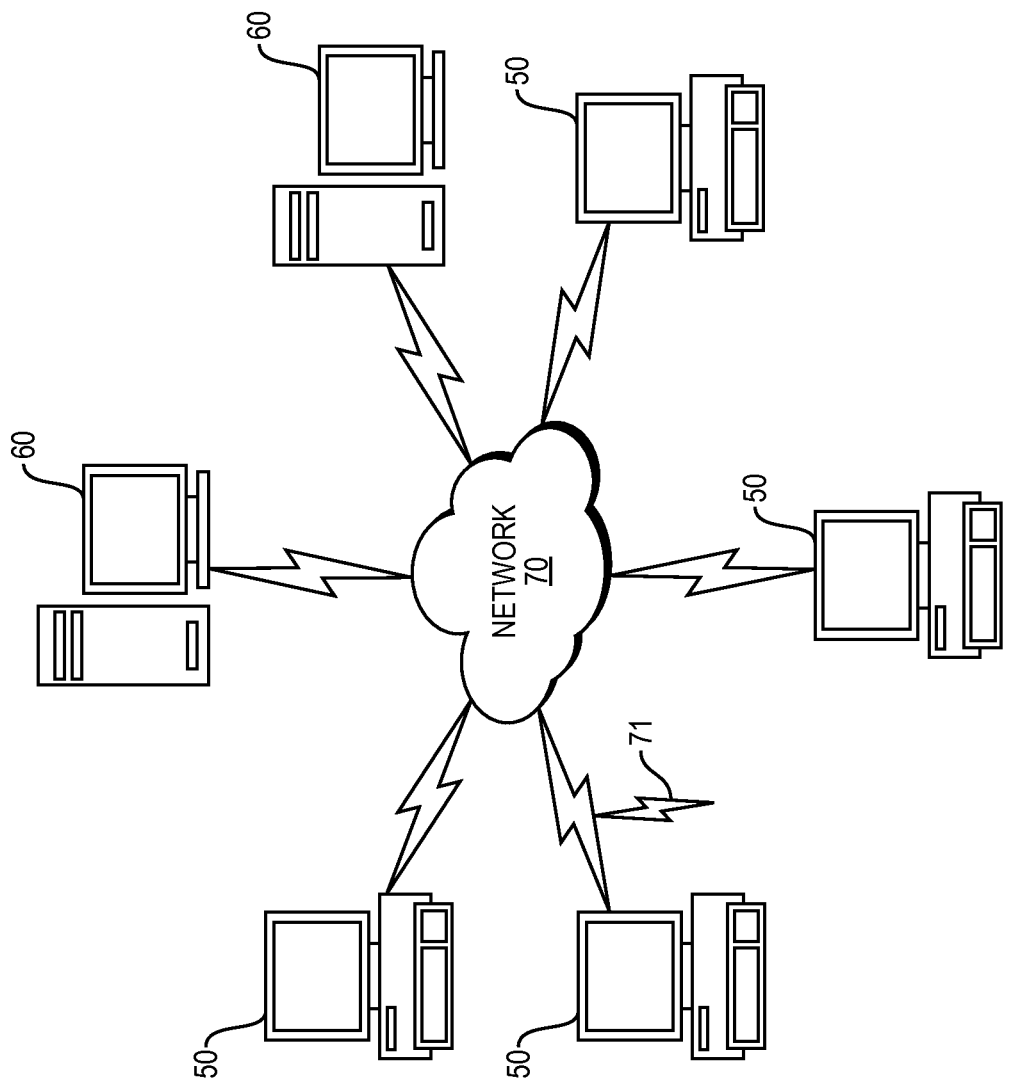
FIG. 6 is a schematic view of a computer network in which embodiments of the present invention operate.

With reference to FIG. 6, the exemplary system 100 is deployed in a computer network formed of client computers 50 and server computers 60. Other computer architecture or similar digital processing environment is suitable.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 7:
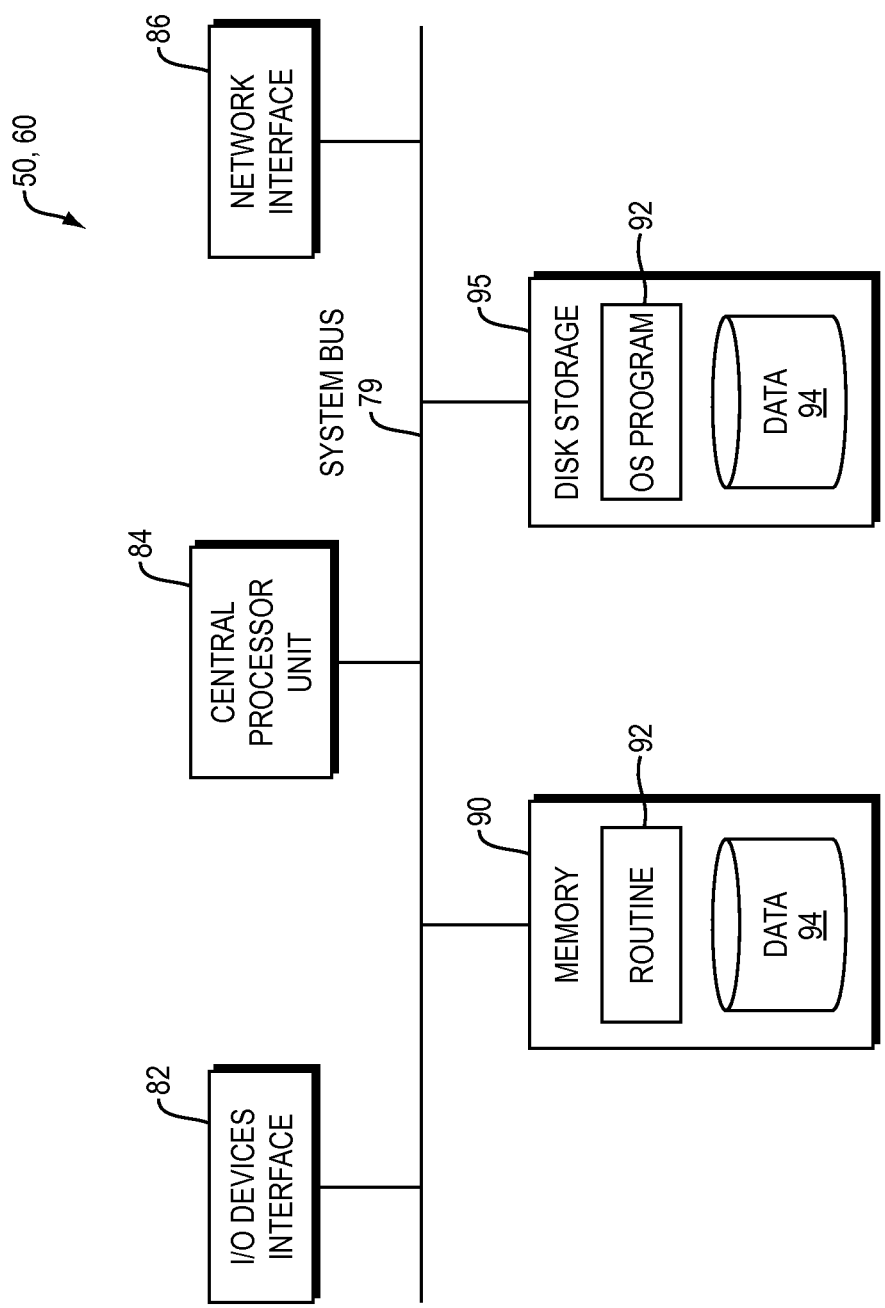
FIG. 7 is a block diagram of the computer nodes of FIG. 6.

FIG. 7 is a diagram of the internal structure of a computer (e.g., client processor/device 50 or server computers 60) in the computer system of FIG. 6. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 6). Memory 90 provides volatile storage for computer software instructions 92 and data 94 used to implement an embodiment of the present invention (e.g., Converter 130, Application Adapters 120, Flowsheet objects 201 and supporting code detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 71 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or carrier encompasses the foregoing transient signals, propagated signals, propagated medium, storage medium, other non-transient medium and the like.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of process control, comprising:
   having plural model-based process engineering applications executed with respect to a refinery or plant, the model-based process engineering applications having respective different software models representing the refinery or plant;
   receiving a first model with respect to the refinery or plant, by interfacing with a first model-based process engineering application, wherein the first model comprises a first application structure specific to the first application;
   receiving a second model with respect to the refinery or plant, by interfacing with a second model-based process engineering application, wherein the second model comprises a second application structure specific to the second application, and the second application structure being inconsistent with the first application structure;
   automatically locating and extracting common model elements from the first model and the second model by a processor executing: (i) a first adapter configured to locate and extract the common model elements from the first model based on the first application structure, and (ii) a second adapter configured to locate and extract the common model elements from the second model based on the second application structure;
   converting the extracted common model elements into a single canonical flowsheet representation of the first model and second model, the converting including the processor automatically:
     (a) forming the extracted common model elements of the first model and the second model into a consistent application structure with respect to the first application and the second application, the consistent application structure being defined as a set of logical entities,
     (b) generating the single canonical flowsheet representation from the consistent application structure, and
     (c) using the generated single canonical flowsheet representation as an intermediary for other software applications to interface with the first model and the second model to access data from the first model and the second model;
   enhancing simulation and process engineering of the refinery or plant by executing a third model-based process engineering application from the generated single canonical flowsheet representation, the executed third model-based process engineering application determining optimized flows and conditions that run the refinery or plant at maximum efficiency based on the generated single canonical flowsheet representation,
     wherein the executed third model-based process engineering application determining the optimized flows and conditions by at least one of navigating, querying, and filtering model elements of the first and second model-based process engineering applications using the generated single canonical flowsheet representation; and
   displaying on a user interface a graphical representation of the generated single canonical flowsheet representation, wherein the graphical representation provides visualizing and navigating modeled physical assets and streams of each of the plural model-based process engineering applications in a consistent manner.

2. The method of claim 1, wherein the set of logical entities includes: a Model entity, a Case entity, an Equipment entity, and a Stream entity that form a flowsheet object.

3. The method of claim 1, wherein the first and second model-based process engineering applications include PIMS, APS, HYSYS, or AORA.

4. The method of claim 1, wherein the steps of locating and extracting effectively provide:
   from the received first model and received second model, determining and extracting common model elements that are model elements in common between the received first and second models, such that the extracted model elements of the received second model correspond to the extracted model elements of the received first model by being model elements in common; and wherein the step of converting the extracted model elements includes:
forming a respective hierarchy of the extracted common model elements for each of the received first model and the received second model; and
from the respective hierarchy, generating the single canonical flowsheet representation of the first and second models.

5. The method of claim 4, further including the step of: normalizing the received first model and the received second model given the respective specific data structures of the first and second model-based process engineering applications to enable a generic canonical representation.

6. The method of claim 1, further including the step of: providing a layered application framework for interfacing with higher-level software applications.

7. The method of claim 6, wherein the higher-level applications include an application outputting the canonical flowsheet representation to one of a computer display monitor, an output file, or a combination thereof.

8. The method of claim 7, wherein the higher-level applications further include an application having the user interface enabling a customized graphical canonical representation.

9. The method of claim 7, wherein the higher-level applications include an application executing the first and the second model-based process engineering applications as a canonical representation.

10. A computer system for simulation and process control, comprising:
plural model-based applications executed with respect to a refinery or plant, the model-based engineering applications having respective different software models representing the refinery or plant;
an input means for obtaining a first model with respect to the refinery or plant from a first model-based application, wherein the first model comprises a first application structure specific to the first application, and
the input means obtaining a second model with respect to the refinery or plant from a second model-based application, wherein the second model comprises a second application structure specific to the second application, the first application structure being inconsistent with the second application structure;
a digital processor;
a working memory accepting from the input means the first model and the second model;
a set of application-specific adaptors coupled to the working memory to automatically locate and extract common model elements from the first model and the second model, including a first adaptor and a second adaptor wherein:
  (i) the first adaptor automatically locates and extracts the common model elements from the first model based on the first application structure, and
  (ii) the second adaptor automatically locates and extracts the common model elements from the second model based on the second application structure;
a converter executed by the digital processor and operatively coupled to the working memory, and responsive to the adaptors, the converter converting the extracted common model elements into a single canonical flowsheet representation of the first model and second model, the converting including the digital processor:
  (a) forming the extracted common model elements of the first model and the second model into a consistent application structure with respect to the first application and the second application, the consistent application structure being defined as a set of logical entities,
  (b) generating the single canonical flowsheet representation from the consistent application structure, and
  (c) outputting the generated single canonical flowsheet representation to a user application to use as an intermediary to interface with the first model and second model to access data from the first model and the second model;
a simulator executed by the digital processor, the simulator enhancing simulation and process engineering of the refinery or plant by executing a third model-based process engineering application from the generated single canonical flowsheet representation, the executed third model-based process engineering application determining optimized flows and conditions that run the refinery or plant at maximum efficiency based on the generated single canonical flowsheet representation,
  wherein the executed third model-based process engineering application determining the optimized flows and conditions by at least one of navigating, querying, and filtering model elements of the first and second model-based process engineering applications using the generated single canonical flowsheet representation; and
a user interface executed by the digital processor, the user interface displaying a graphical representation of the generated single canonical flowsheet representation, wherein through the graphical representation, visualizing and navigating modeled physical assets and streams of each of the plural model-based applications is in a consistent manner.

11. The computer system of claim 10, wherein the first and second model-based applications include PIMS, APS, HYSYS, or AORA.

12. The computer system of claim 10, wherein the converter further:
using the application-specific adaptors, determines and extracts common model elements that are model elements in common between the obtained first model and the obtained second model, such that the extracted model elements of the obtained second model correspond to the extracted model elements of the obtained first model by being model elements in common;
forms a respective hierarchy of the extracted common model elements for each of the obtained first model of the first application and the obtained second model of the second application; and
from the respective hierarchy, generates the single canonical flowsheet representation of the first and second models.

13. The computer system of claim 12, wherein the processor further normalizes the obtained first model and the obtained second model given the respective specific data structures of the first and second model-based applications to enable a generic canonical representation.

14. The computer system of claim 10, wherein the set of logical entities includes: a Model entity, a Case entity, an Equipment entity, and a Stream entity that form a flowsheet object.

15. A computer program product, comprising:
a non-transient computer readable storage medium having stored thereon a set of computer program instructions for process control by converting process engineering application models into a canonical representation, the set of instructions being among plural model-based process engineering applications executed with respect to a refinery or plant, the model-based process engineering applications having respective different software models representing the refinery or plant; and
the set of instructions including the instructions to:
receive a first model with respect to the refinery or plant, from a first model-based process engineering application, the first model comprising a first application structure specific to the first application;
receive a second model with respect to the refinery or plant, from a second model-based process engineering application, the second model comprising a second application structure specific to the second application, the first application structure being inconsistent with the second application structure;
automatically locate and extract common model elements from the first model and the second model by a processor executing: (i) a first adapter configured to locate and extract the common model elements from the first model based on the first application structure, and (ii) a second adapter configured to locate and extract the common model elements from the second model based on the second application structure;
convert the extracted common model elements of the first model and the second model into a single canonical representation of the first model and the second model, the converting including the processor automatically:
(a) forming the extracted common model elements of the first model and the second model into a consistent application structure with respect to the first application and the second application, the consistent application structure being defined as a set of logical entities,
(b) generating the single canonical flowsheet representation from the consistent application structure, and
(c) using the generated single canonical representation as an intermediary for other software applications to interface with the first model and the second model to access data from the first model and the second model;
enhance simulation and process engineering of the refinery or plant by executing a third model-based process engineering application from the generated single canonical flowsheet representation, the executed third model-based process engineering application determining optimized flows and conditions that run the refinery or plant at maximum efficiency based on the generated single canonical flowsheet representation,
wherein the executed third model-based process engineering application determining the optimized flows and conditions by at least one of navigating, querying, and filtering model elements of the first and second model-based process engineering applications using the generated single canonical flowsheet representation; and
display on a user interface a graphical representation of the generated single canonical flowsheet representation, wherein through the graphical representation, visualizing and navigating modeled physical assets and streams of each of the plural model-based process engineering applications is in a consistent manner.

16. The computer program product of claim 15, wherein at least some portion of the set of computer program instructions include instructions to request data or request instructions over a computer network.

17. The computer program product of claim 15, wherein the instructions to convert the extracted model elements into a single canonical representation include the instructions to:
determine and extract common model elements from the normalized received first model and the normalized received second model, the extracted common model elements being model elements in common across the first application and the second application;
form a respective hierarchy of the extracted common model elements for each of the received first model and the received second model; and
from the formed respective hierarchy, generate the single canonical flowsheet representation of the first and second models of the first and second model-based process engineering applications.

18. The computer program product of claim 15, wherein the set of logical entities includes: a Model entity, a Case entity, an Equipment entity, and a Stream entity that form a flowsheet object.

* * * * *